US009355933B2

(12) United States Patent
Ching et al.

(10) Patent No.: US 9,355,933 B2
(45) Date of Patent: May 31, 2016

(54) COOLING CHANNELS IN 3DIC STACKS

(71) Applicant: Taiwan Semiconductor Manufacturing Company, Ltd., Hsin-Chu (TW)

(72) Inventors: Kai-Ming Ching, Jhudong Township (TW); Ching-Wen Hsiao, Hsin-Chu (TW); Tsung-Ding Wang, Tainan (TW); Ming Hung Tseng, Toufen Township (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 71 days.

(21) Appl. No.: 14/132,515

(22) Filed: Dec. 18, 2013

(65) Prior Publication Data

US 2014/0103540 A1 Apr. 17, 2014

Related U.S. Application Data

(62) Division of application No. 12/616,562, filed on Nov. 11, 2009, now Pat. No. 8,624,360.

(60) Provisional application No. 61/114,367, filed on Nov. 13, 2008.

(51) Int. Cl.
*H01L 23/46* (2006.01)
*H01L 23/473* (2006.01)
*H01L 23/48* (2006.01)
(Continued)

(52) U.S. Cl.
CPC .............. *H01L 23/46* (2013.01); *H01L 23/473* (2013.01); *H01L 23/481* (2013.01); *H01L 23/5226* (2013.01); *H01L 24/82* (2013.01); *H01L 2224/0401* (2013.01); *H01L 2224/0557* (2013.01); *H01L 2224/06181* (2013.01); *H01L 2224/131* (2013.01); *H01L 2224/13147* (2013.01); *H01L 2924/0002* (2013.01); *H01L 2924/00014* (2013.01)

(58) Field of Classification Search
CPC ... H01L 23/46; H01L 23/522; H01L 23/5226; H01L 23/00; H01L 23/48; H01L 23/528
USPC .................. 438/629, 637, 639, 109, 273, 531
See application file for complete search history.

(56) References Cited

U.S. PATENT DOCUMENTS 5,391,917 A 2/1995 Gilmour et al.
5,510,298 A 4/1996 Redwine
(Continued)

OTHER PUBLICATIONS

King Jr., C.R. et al. "3D Stacking of Chips with Electrical and Microfluidic I/O Interconnects," 2008 Electronic Components and Technology Conference, IEEE, May 2008, pp. 1-7.
(Continued)

*Primary Examiner* — Chuong A Luu
(74) *Attorney, Agent, or Firm* — Slater Matsil, LLP

(57) ABSTRACT

An integrated circuit structure includes a die including a semiconductor substrate; dielectric layers over the semiconductor substrate; an interconnect structure including metal lines and vias in the dielectric layers; a plurality of channels extending from inside the semiconductor substrate to inside the dielectric layers; and a dielectric film over the interconnect structure and sealing portions of the plurality of channels. The plurality of channels is configured to allow a fluid to flow through.

20 Claims, 16 Drawing Sheets

(51) Int. Cl.
*H01L 23/522* (2006.01)
*H01L 23/00* (2006.01)

(56) References Cited

U.S. PATENT DOCUMENTS

| | | | |
|---|---|---|---|
| 5,767,001 | A | 6/1998 | Bertagnolli et al. |
| 5,998,292 | A | 12/1999 | Black et al. |
| 6,184,060 | B1 | 2/2001 | Siniaguine |
| 6,322,903 | B1 | 11/2001 | Siniaguine et al. |
| 6,448,168 | B1 | 9/2002 | Rao et al. |
| 6,465,892 | B1 | 10/2002 | Suga |
| 6,472,293 | B1 | 10/2002 | Suga |
| 6,538,333 | B2 | 3/2003 | Kong |
| 6,599,778 | B2 | 7/2003 | Pogge et al. |
| 6,639,303 | B2 | 10/2003 | Siniaguine |
| 6,664,129 | B2 | 12/2003 | Siniaguine |
| 6,693,361 | B1 | 2/2004 | Siniaguine et al. |
| 6,740,582 | B2 | 5/2004 | Siniaguine |
| 6,800,930 | B2 | 10/2004 | Jackson et al. |
| 6,841,883 | B1 | 1/2005 | Farnworth et al. |
| 6,882,030 | B2 | 4/2005 | Siniaguine |
| 6,924,551 | B2 | 8/2005 | Rumer et al. |
| 6,962,867 | B2 | 11/2005 | Jackson et al. |
| 6,962,872 | B2 | 11/2005 | Chudzik et al. |
| 7,030,481 | B2 | 4/2006 | Chudzik et al. |
| 7,049,170 | B2 | 5/2006 | Savastiouk et al. |
| 7,060,601 | B2 | 6/2006 | Savastiouk et al. |
| 7,071,546 | B2 | 7/2006 | Fey et al. |
| 7,111,149 | B2 | 9/2006 | Eilert |
| 7,122,912 | B2 | 10/2006 | Matsui |
| 7,157,787 | B2 | 1/2007 | Kim et al. |
| 7,193,308 | B2 | 3/2007 | Matsui |
| 7,262,495 | B2 | 8/2007 | Chen et al. |
| 7,297,574 | B2 | 11/2007 | Thomas et al. |
| 7,335,972 | B2 | 2/2008 | Chanchani |
| 7,355,273 | B2 | 4/2008 | Jackson et al. |
| 2003/0173674 | A1* | 9/2003 | Nakamura ............ 257/758 |
| 2008/0266787 | A1* | 10/2008 | Gosset et al. ............ 361/689 |

OTHER PUBLICATIONS

Sekar, et al., A 3D-IC Technology with Integrated Microchannel Cooling, IEEE, Jun. 2008, pp. 13-15.

* cited by examiner

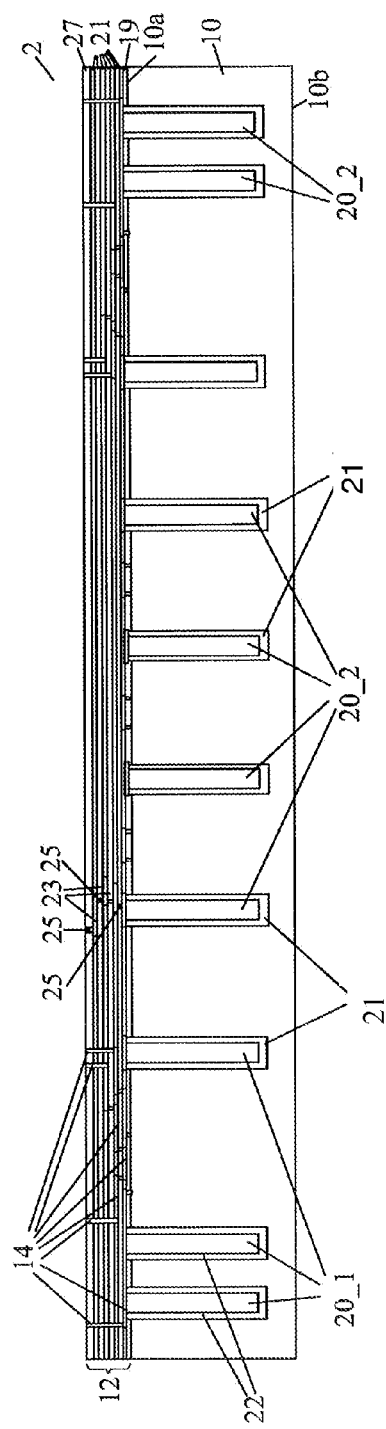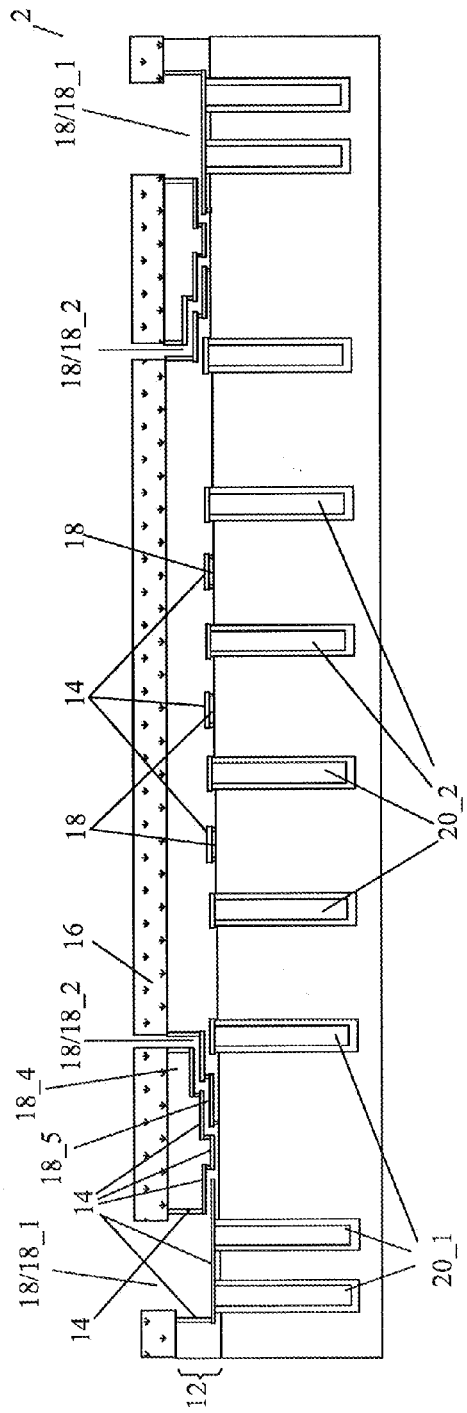

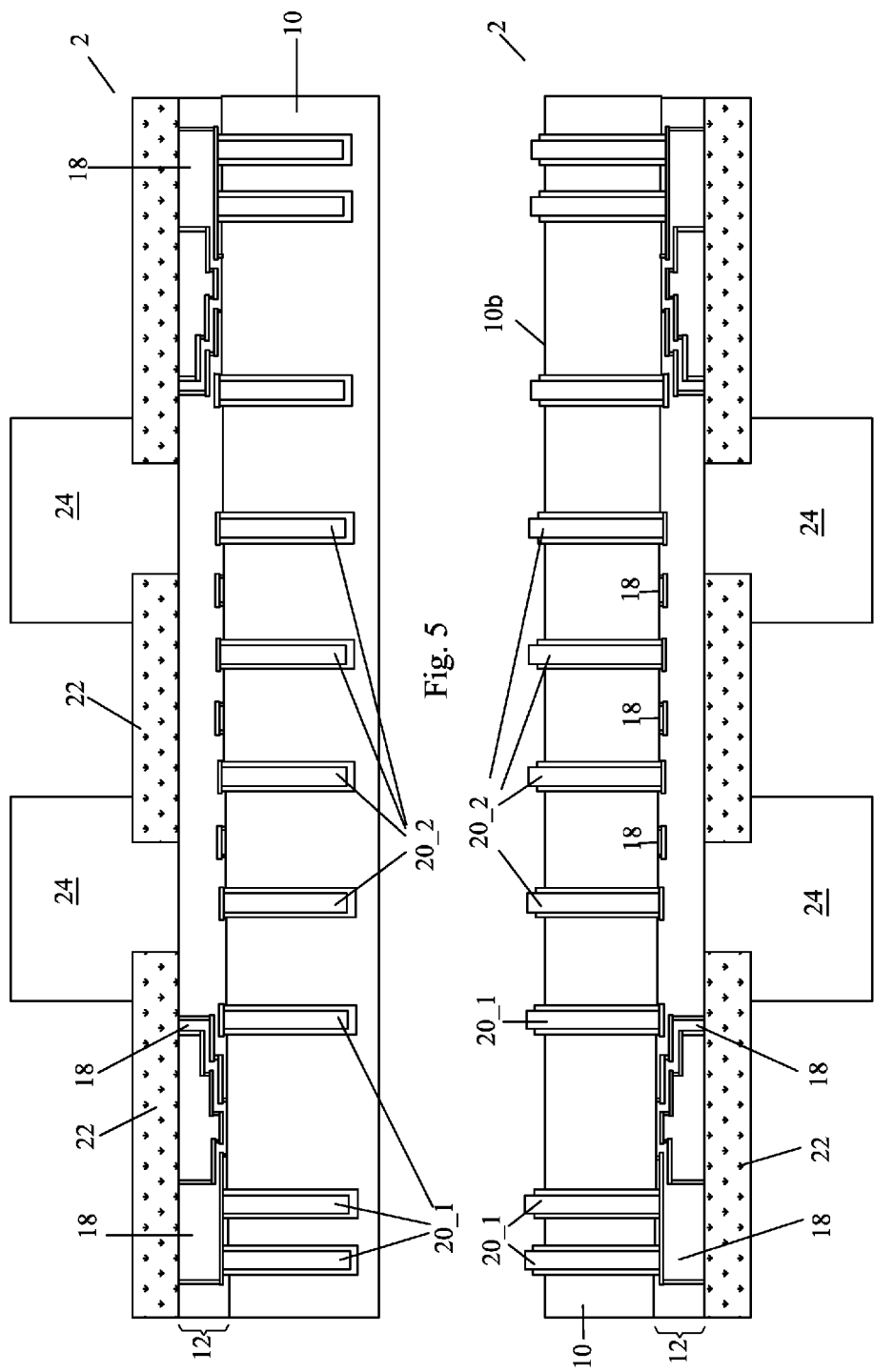

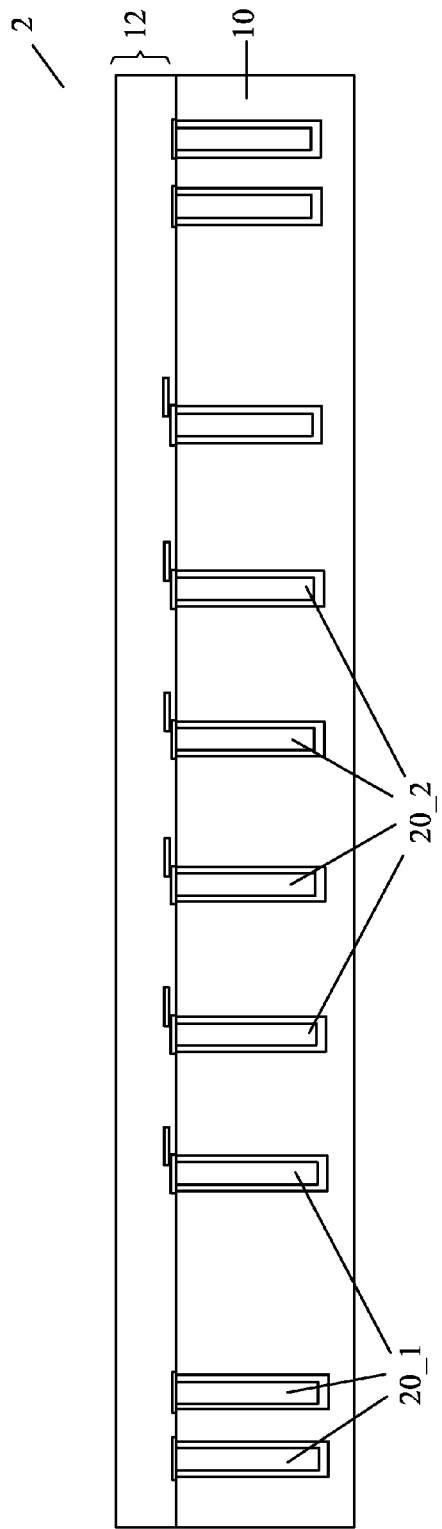
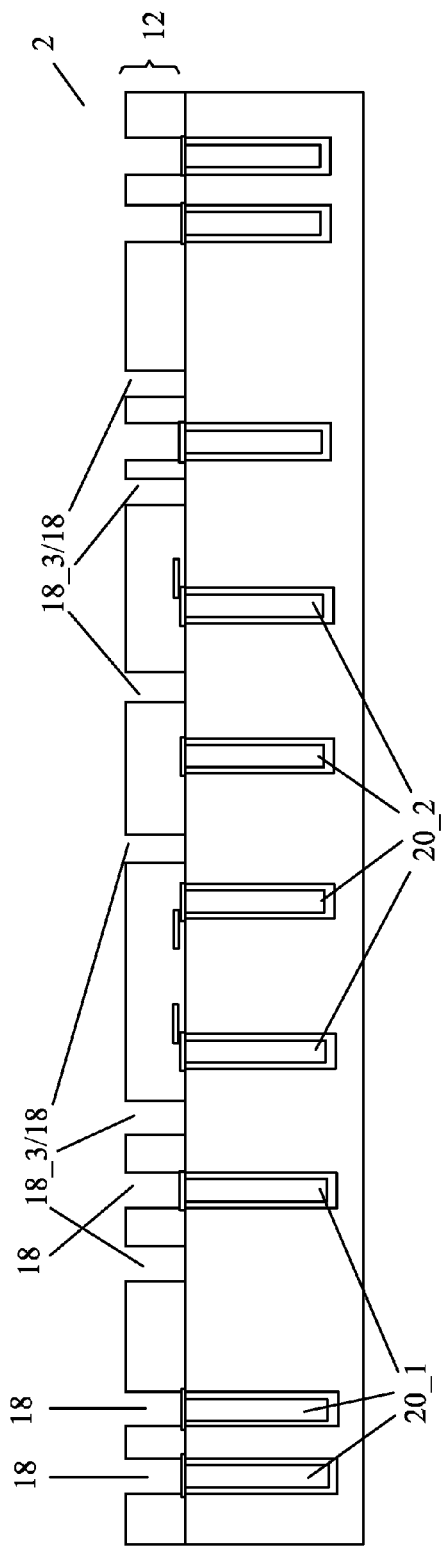

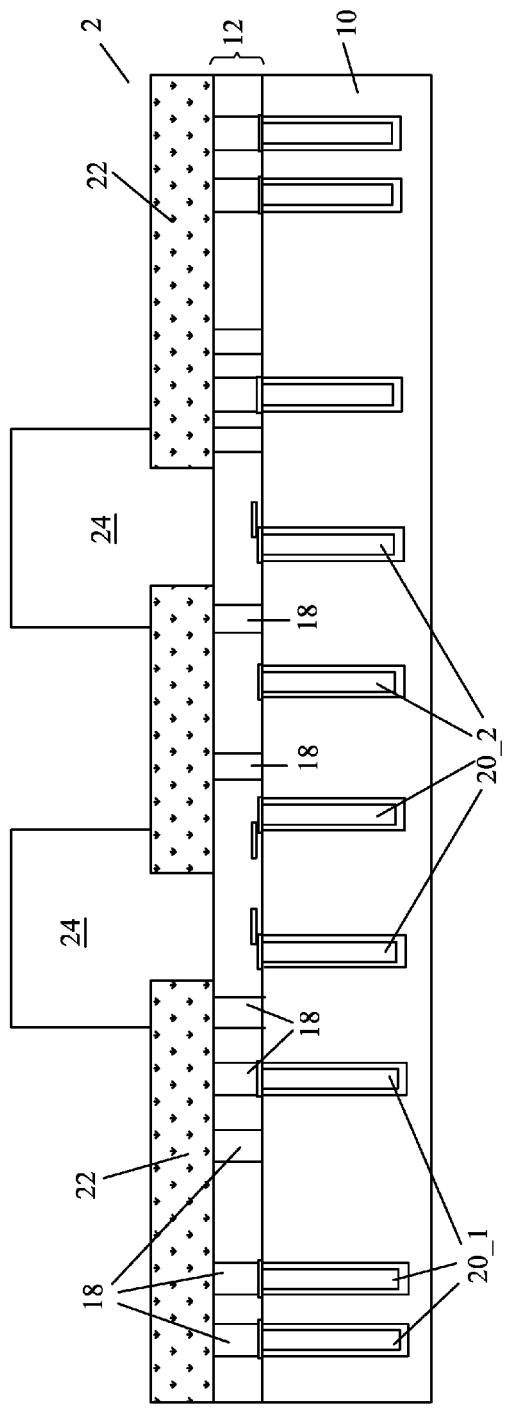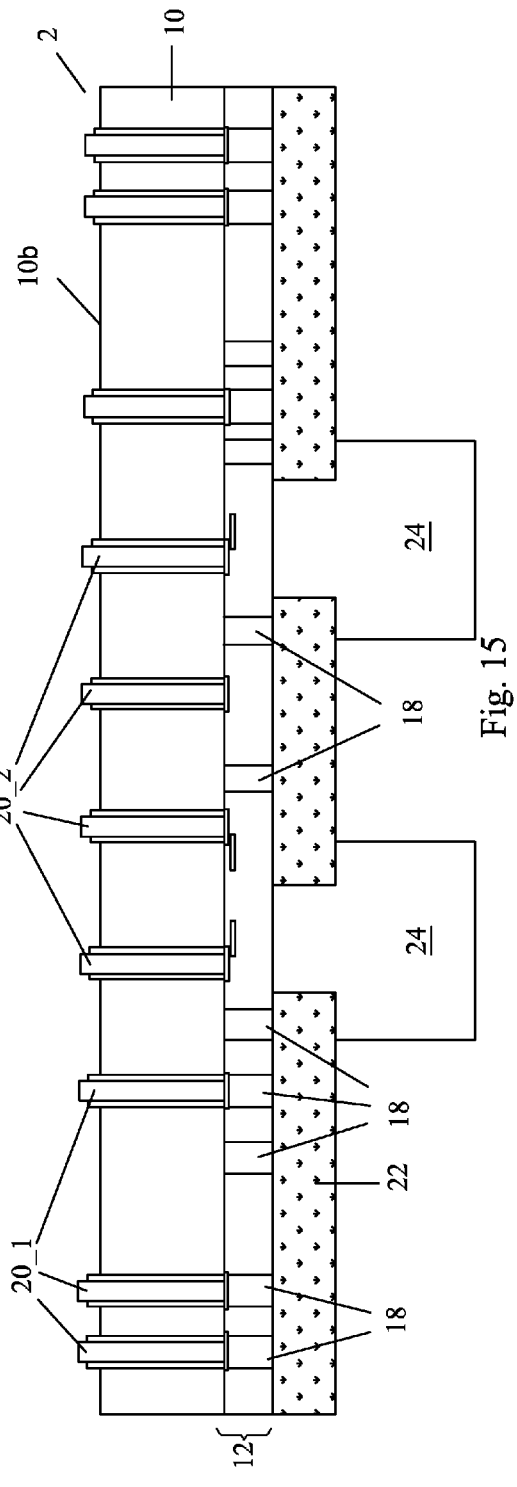

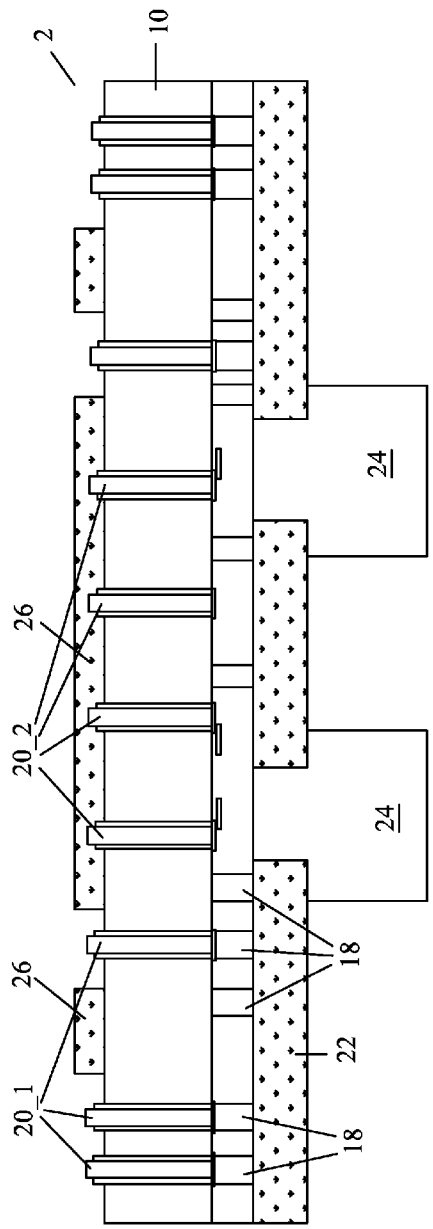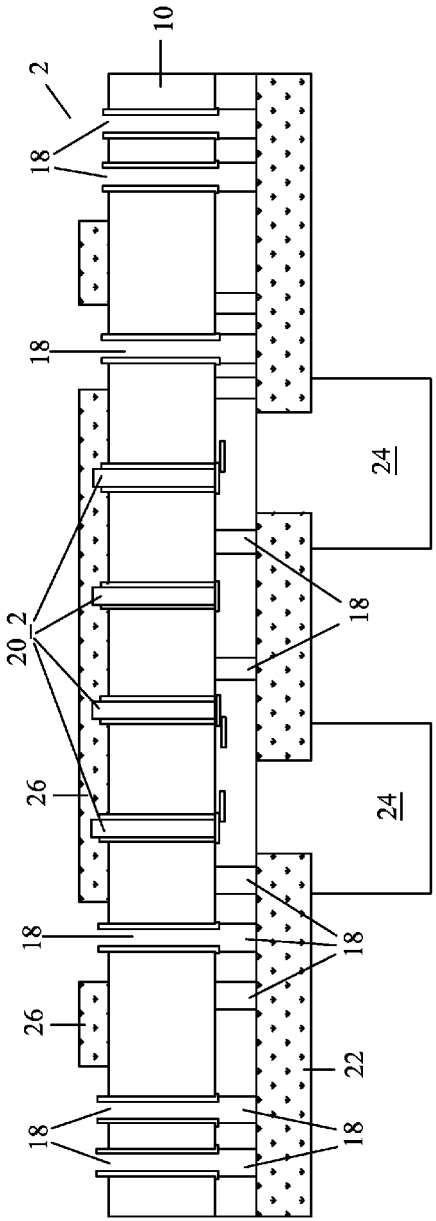

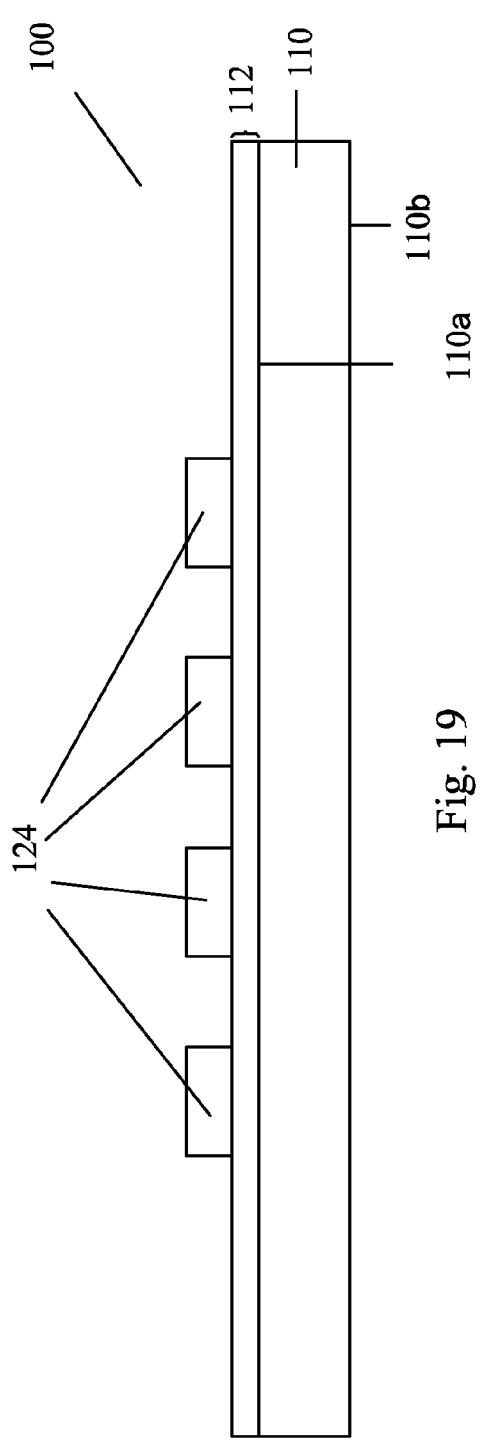
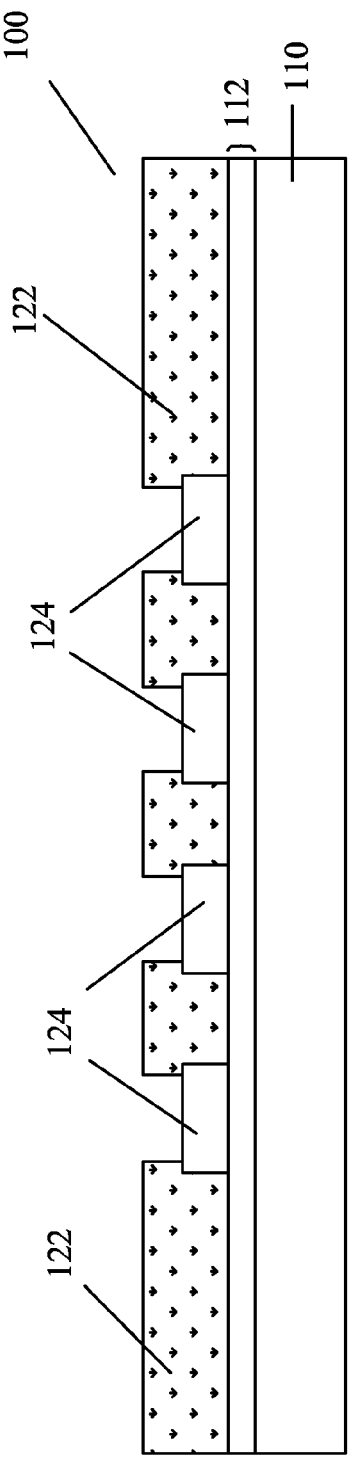
Fig. 19
Fig. 20

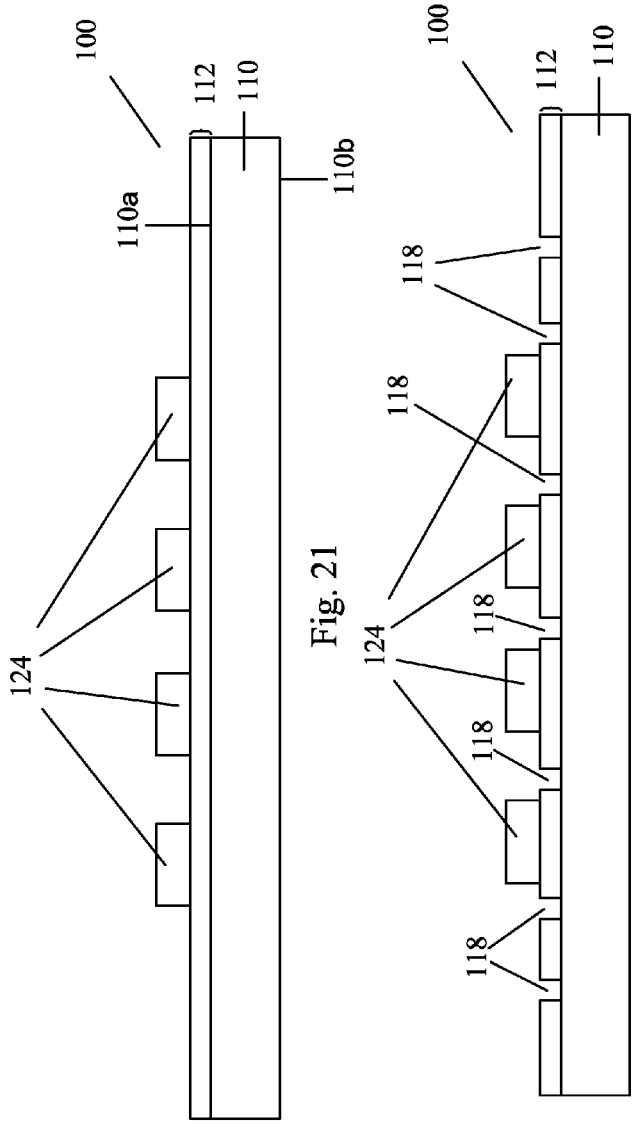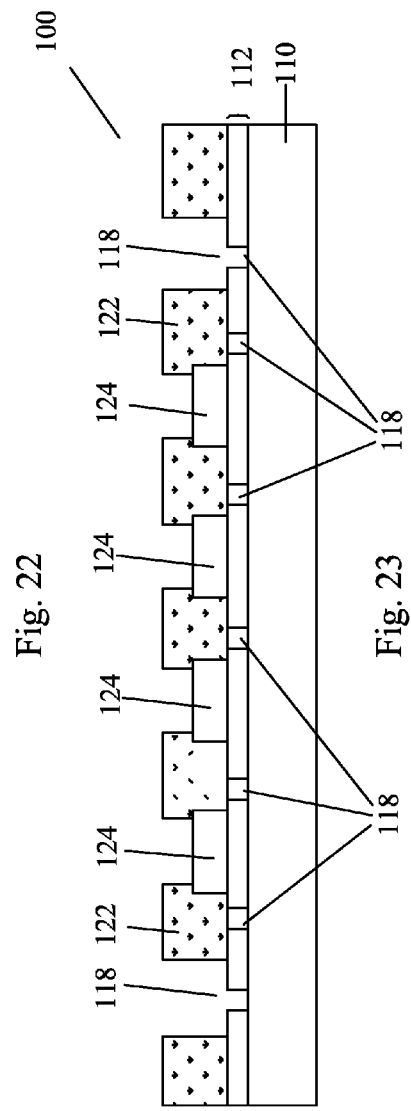

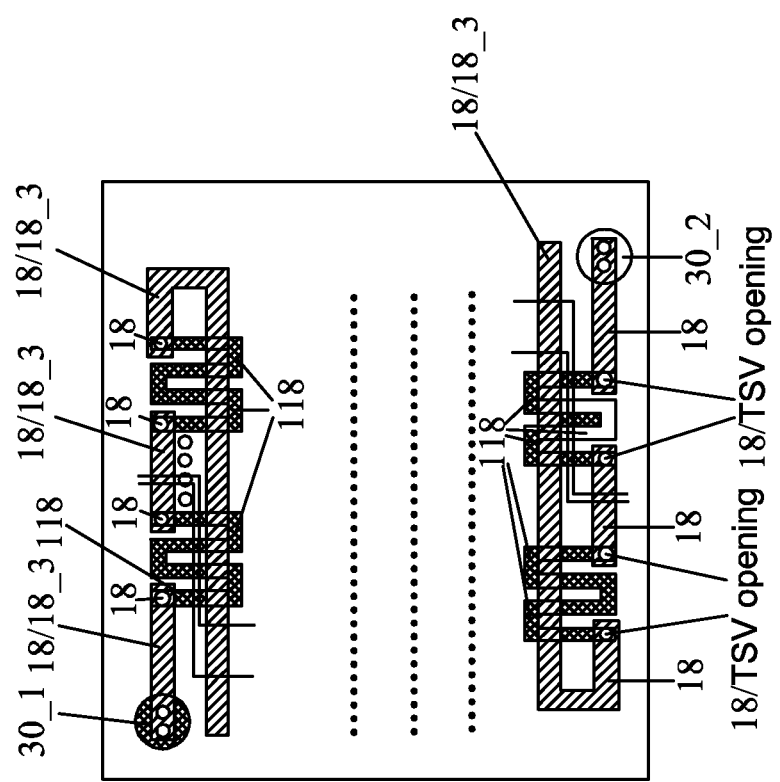

US 9,355,933 B2

COOLING CHANNELS IN 3DIC STACKS

This application is a divisional of U.S. patent application Ser. No. 12/616,562, entitled "Cooling Channels in 3DIC Stacks," filed on Nov. 11, 2009 now U.S. Pat. No. 8,624,360, which application claims the benefit of the following provisionally filed U.S. Patent Application: Application Ser. No. 61/114,367, filed Nov. 13, 2008, and entitled "Cooling Structures and TSV Structures for 3DIC Stacking," which application is hereby incorporated herein by reference.

TECHNICAL FIELD

This disclosure relates generally to integrated circuit devices and more particularly to semiconductor dies and packages and methods of forming the same.

BACKGROUND

Since the invention of integrated circuits, the semiconductor industry has experienced continuous rapid growth due to constant improvements in the integration density of various electronic components (i.e., transistors, diodes, resistors, capacitors, etc.). For the most part, this improvement in integration density has come from repeated reductions in the minimum feature size, allowing more components to be integrated into a given chip area. These integration improvements are essentially two-dimensional (2D) in nature, in that the volume occupied by the integrated components is essentially on the surface of the semiconductor wafer. Although dramatic improvements in lithography have resulted in considerable improvements in 2D integrated circuit formation, there are physical limitations to the density that can be achieved in two dimensions. One of these limitations is the minimum size needed to make these components. Also, when more devices are put into one chip, more complex designs are required.

To solve the above-discussed problems, three-dimensional integrated circuits (3DICs) and stacked dies are commonly used. The dies are stacked and the integrated circuits in the stacked dies are interconnected or routed through through-silicon vias (TSVs).

A known problem in the stacked dies is the heat dissipation. For example, when a top die is stacked to a bottom die, a heat sink may be mounted on the top die. Accordingly, the top die may have a good heat-dissipating ability. However, the heat generated in the bottom die needs to travel through the top die before it may reach the heat sink, and hence the bottom die may suffer from the heat-dissipating problem. The problem may become severe when the bottom die generates a lot of heat, for example, when the bottom die is a computing die, such as a central processing unit (CPU).

SUMMARY

In accordance with one aspect, an integrated circuit structure includes a die including a semiconductor substrate; dielectric layers over the semiconductor substrate; an interconnect structure, including metal lines and vias in the dielectric layers; a plurality of channels extending from inside the semiconductor substrate to inside the dielectric layers; and a dielectric film over the interconnect structure and sealing portions of the plurality of channels. The plurality of channels is configured to allow a fluid to flow through.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 18 are cross-sectional views of intermediate stages in the manufacturing of channels in a first wafer/die;

FIGS. 19 through 23 are cross-sectional views of intermediate stages in the manufacturing of channels in a second wafer/die;

FIG. 27 illustrates a top view of the channels.

DETAILED DESCRIPTION OF ILLUSTRATIVE EMBODIMENTS

Figure 3:
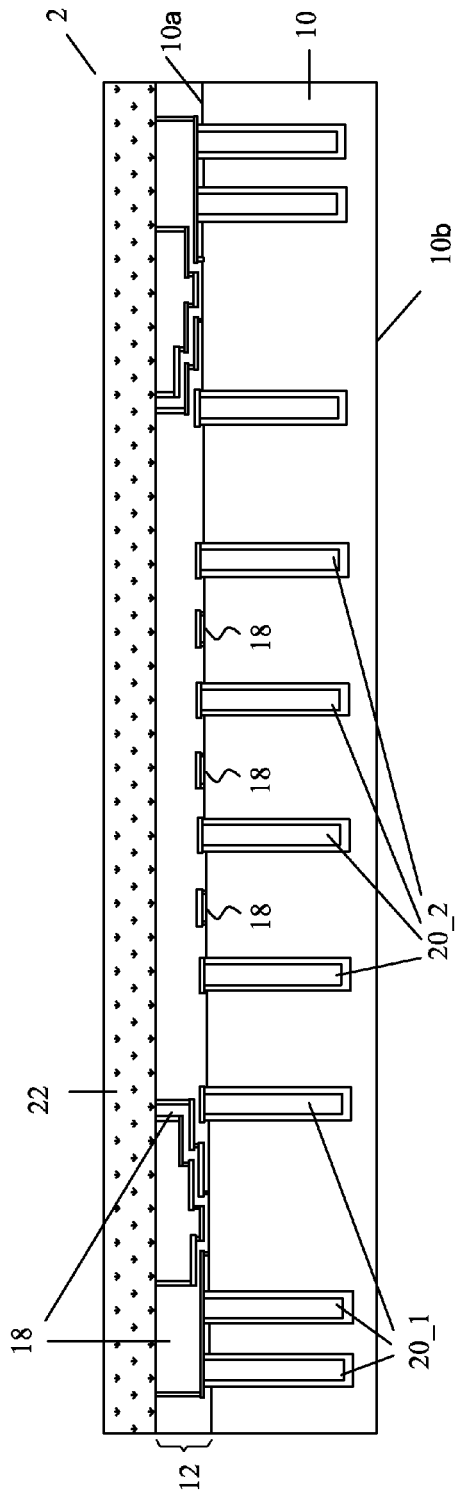

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel integrated circuit structure, including cooling channels and the method of forming the same, is presented. The intermediate stages of manufacturing an embodiment are illustrated. The variations and the operation of the embodiment are discussed. Throughout the various views and illustrative embodiments, like reference numbers are used to designate like elements.

Referring to FIG. 1, wafer 2, which includes substrate 10, is provided. Wafer 2 is also referred to as a bottom wafer. Substrate 10 may be a semiconductor substrate such as a bulk silicon substrate, although it may include other semiconductor materials, such as group III, group IV, and/or group V elements. Semiconductor devices, such as transistors (not shown) may be formed at the front surface/side 10a (the surface 10a facing up in FIG. 1) of substrate 10. The back surface/side of substrate 10 is marked as 10b.

Through-substrate vias (TSVs) 20 (also denoted as 20_1 or 20_2) are formed to extend from front surface 10a of substrate 10 into substrate 10. Isolation layers 21 are formed on the sidewalls and bottom of TSV 20, and electrically insulates TSV 20 from substrate 10. Isolation layers 21 may be formed of commonly used dielectric materials such as silicon nitride, silicon oxide (for example, tetra-ethyl-ortho-silicate (TEOS) oxide), and the like. TSVs 20 include TSVs 20_2 that are signal TSVs for conducting electrical signals, and TSVs 20_1 that are used for forming channels used to conduct a cooling agent, such as water.

Interconnect structure 12, which includes metal lines 23 and vias 25 formed therein, is formed on front side 10a of substrate 10 and may be connected to the semiconductor devices. Interconnect structure 12 may include a commonly known inter-layer dielectric (ILD) layer (such as exemplary layer 19) and inter-metal dielectric (IMD) layers 21, which may be formed of low-k dielectric materials having k values lower than about 2.5, or even lower than about 2.0. Further, passivation layer(s) (such as exemplary layer 27) may be formed as a top portion of interconnect structure 12. The passivation layer(s) may be formed of materials, such as silicon oxide, silicon nitride, un-doped silicate glass (USG), polyimide, and/or multi-layers thereof. The details of dielectric layers 19, 21, and 27, metal lines 23, and vias 25 are not illustrated in subsequent drawings, although they may be formed in each of the embodiments.

During the formation of interconnect structure 12, channel structures 14 are also formed, which also include metal lines (for example, the portions extending horizontally) and vias (for example, the portions extending vertically). The formation of channel structures 14 and the metal lines and vias for signal connection may include commonly known damascene processes. Channel structures 14 may thus be formed of copper, copper alloys, and the like. Further, channel structures 14 may also include diffusion barrier materials, such as titanium, tantalum, titanium nitride, and tantalum nitride. Channel structures 14 may include a plurality of interconnected portions, each forming a metal pipe encircling a portion of the dielectric layers. Channel structures 14 may include upper portions vertically misaligned to lower portions and/or upper portions vertically aligned to lower portions.

Next, as shown in FIG. 2, the portion of dielectric material (referred to as channel dielectric material hereinafter) encircled by channel structures 14 is removed. The removal process may include forming mask 16 to cover wafer 2 and then patterning mask 16, so that the channel dielectric material is exposed, while other portions of the dielectric material are covered. The channel dielectric material is then removed; for example, by an isotropic etch, such as a wet etch. The spaces left by the removed channel dielectric material are channels 18. The etch may be stopped using copper, tungsten, silicon, metal silicide, and the like as etch stop layers, depending on the design of the resulting channels and where the channels end. For example, on the sidewalls of channels 18, the copper in channel structures 14 may be used for stopping the etch, while at the bottom of channels 18, channels 18 may face substrate 10, and hence metal silicides, such as nickel silicide or cobalt silicide, may be used for stopping the etch. In an embodiment, channels 18 include main channels 18_1 and shafts 18_2 connected to main channels 18_1. The formation of shafts 18_2 may help the removal of the channel dielectric material filling main channels 18_1. Further, in the use of the resulting integrated circuit structure, shafts 18_2 also act as channels for conducting the cooling agent.

It is noted that channels 18, as shown in FIG. 2, may be routed through various layers of interconnect structure 12. As a result of the channel routing, channels 18 may include portions 18_4 and 18_5 that are in different ones of the dielectric layers, and not vertically overlapping each other. This provides the ability for customizing the design of channels 18, so that only the desirable portions of the dielectric layers have channels 18 passing through, while the undesired portions of the dielectric layers do not have channels 18 passing through. For example, some of the metallization layers (such as metal layers 1 and 2, commonly known as M1 and M2, respectively) in interconnect structure 12 may only have a minimum amount of channels 18 passing through, while other portions, such as M8 and M9, may have a significant amount of channels.

Referring to FIG. 3, mask 16 is removed, and dielectric film 22 is laminated on wafer 2. Dielectric film 22 may be a dry film formed of polyimide, poly benzo oxysazole (PBO), epoxy, underfill materials, or the like. Further, dielectric film 22 may be a photosensitive dry film so that the steps of laminating and patterning dielectric film 22 are simplified. In an exemplary embodiment, dielectric film 22 is formed of PerMX300 permanent photoresist provided by DuPont®. With the laminated dielectric film 22 covering channels 18, channels 18 are sealed but not filled.

Figure 4:
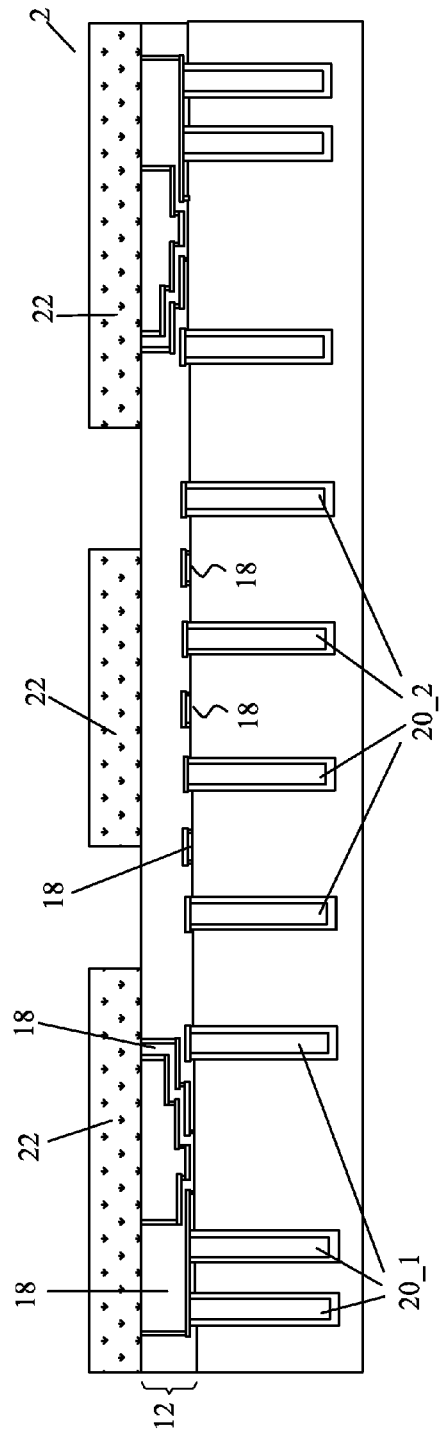

Next, as shown in FIG. 4, dielectric film 22 is patterned, and bumps 24 are formed, with the resulting structure being shown in FIG. 5. Bumps 24 may be solder bumps. In another embodiment, bumps 24 may be copper bumps, including a copper region and a nickel layer (not shown) on the copper region. Further, a thin solder layer (not shown) or thin gold layer (not shown) may be plated on the top of the nickel layer. Bumps 24 may be connected to the integrated circuit devices (not shown) at the surface of substrate 10, and/or electrically connected to signal TSVs 20_2.

Figure 7:
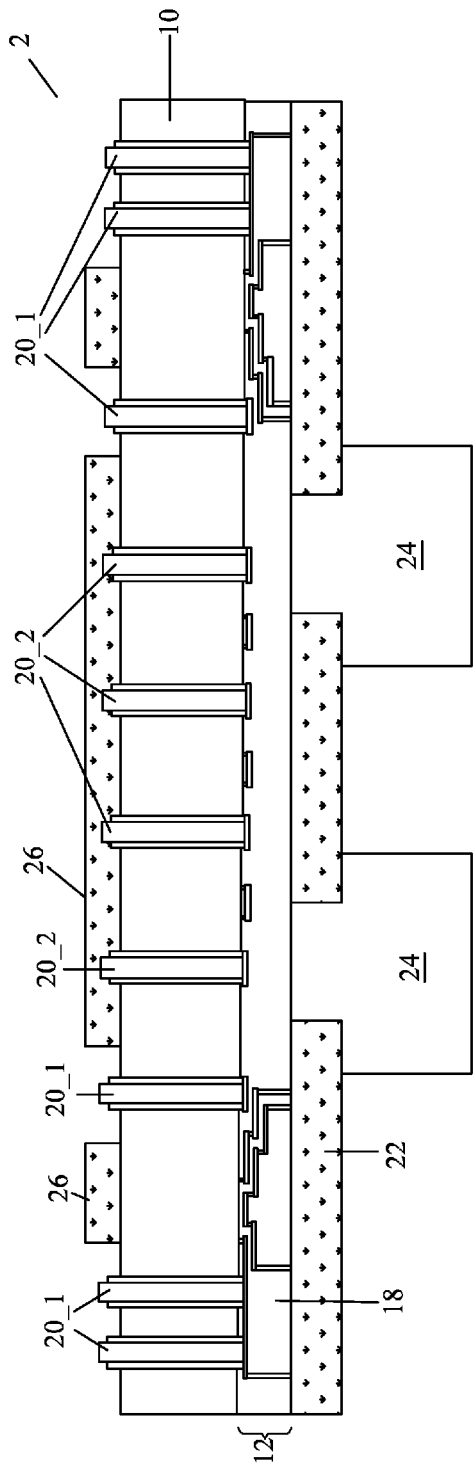
Figure 8:
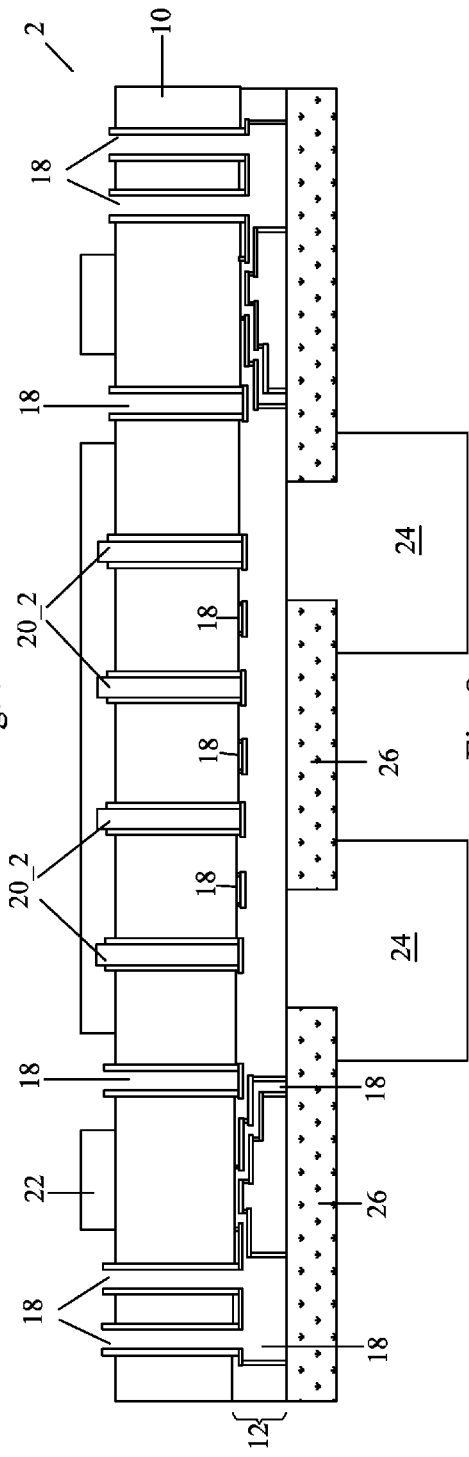
Figure 9:
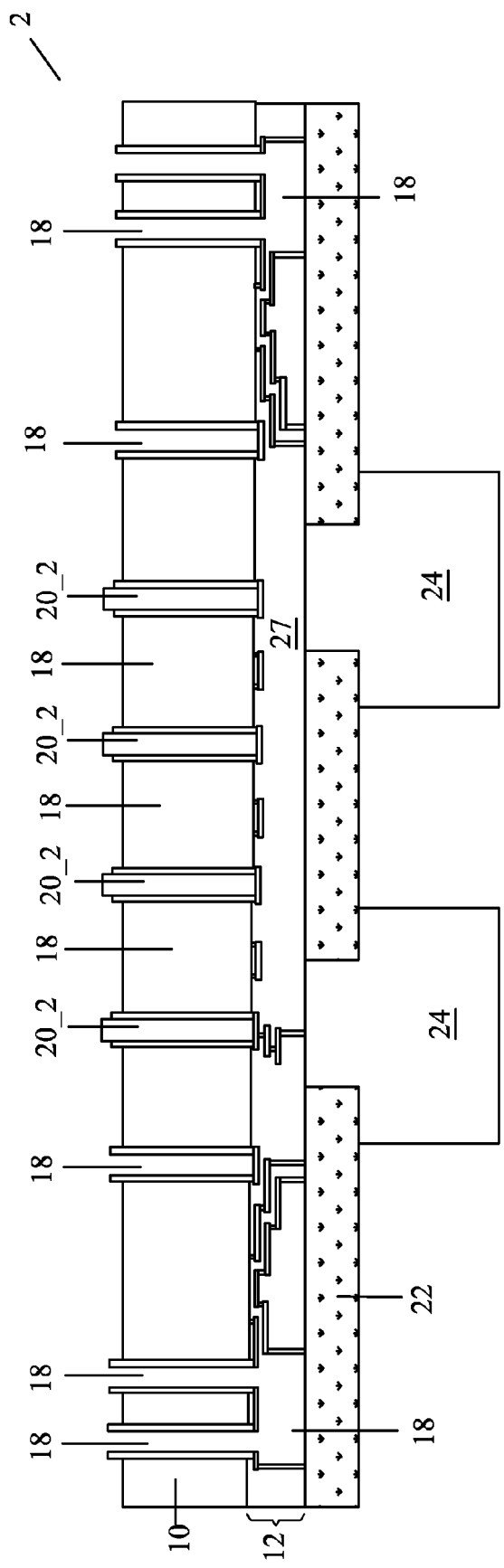

FIG. 6 illustrates the polish of backside 10b of substrate 10, so that TSVs 20 are exposed. Next, as shown in FIG. 7, a backside lithography is performed, and mask 26, which may be a photo resist, is formed and patterned. TSVs 20_1 are exposed through the openings in mask 26, while signal TSVs 20_2 are covered. TSVs 20_1 are then etched through the openings in mask 26, as shown in FIG. 8. The openings left by the removed TSVs 20_1 are connected to the original channels 18. In other words, channels 18 expand into and through substrate 10. The removal process may be controlled, so that channel structures 14 remain to insulate channels 18 from the low-k dielectric materials in interconnect structure 12. In an embodiment, the materials of TSVs 20_1 and/or channel structures 14 are selected to have a high etching selectivity, for example, greater than about 100. In FIG. 9, mask 26 is removed.

FIGS. 10 through 18 illustrate cross-sectional views of intermediate stages in the formation of channels 18 in bottom wafer 2 in accordance with alternative embodiments, except that channels 18 in interconnect structure 12 are vertical and may not have shafts. Unless specified otherwise, the materials and formation methods of the components in this embodiment are essentially the same as the like components, which are denoted by like reference numerals in the embodiment shown in FIGS. 1 through 9. The formation details of the embodiment shown in FIGS. 10 through 18 may thus be found in the discussion of the embodiment shown in FIGS. 1 through 9.

Referring to FIG. 10, wafer 2 including substrate 10 is provided, and TSVs 20 (denoted as 20_1 and 20_2) and interconnect structure 12 are formed. Referring to FIG. 11, channels 18 are formed in interconnect structure 12 by etching through the dielectric materials in interconnect structure 12. TSVs 20 are thus exposed through channels 18. Further, a diffusion barrier layer and a copper layer (not shown) may be formed on the sidewalls of channels 18, so that channels 18 are isolated from the dielectric materials in interconnect structure 12. Alternatively, channel structures 14 (not shown in FIGS. 10 and 11) similar to what is shown in FIG. 1 may be formed, except channel structures 14 in this embodiment may not include any shaft, and hence the resulting channels 18 have smooth and vertical sidewalls. FIG. 11 also illustrates that some of channels 18_3 are not directly over any of TSVs 20. Although channels 18_3 are illustrated as isolated from each other in the cross-sectional view in FIG. 11, they may be interconnected if illustrated in a top view, as shown in FIG. 27.

Figure 12:
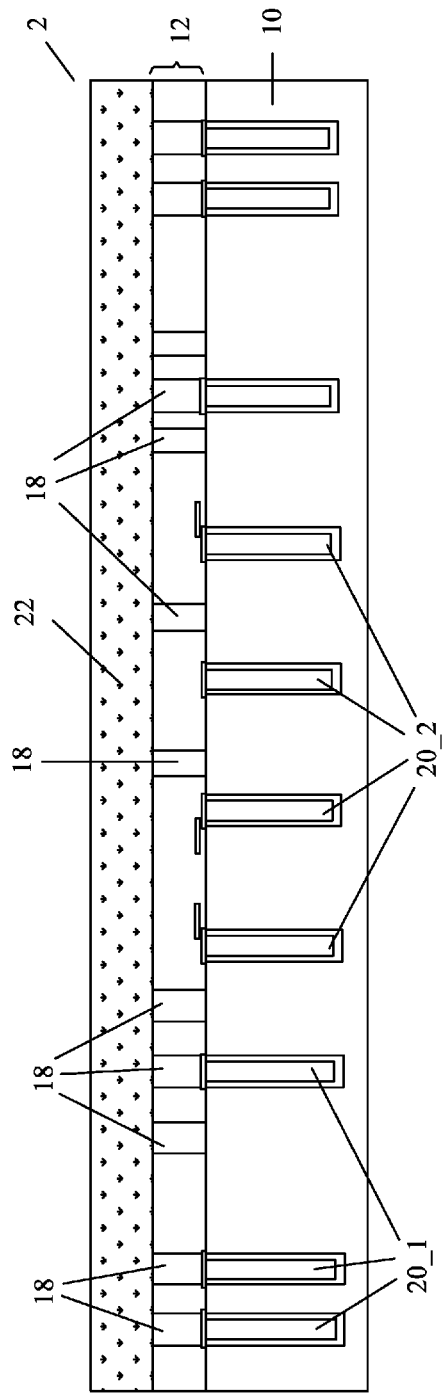
Figure 13:
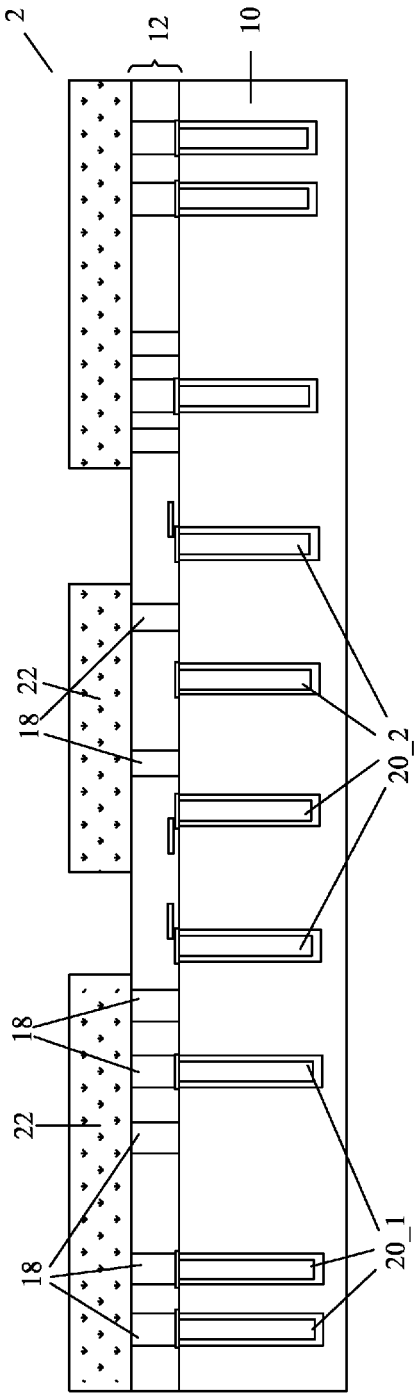
Figure 18:
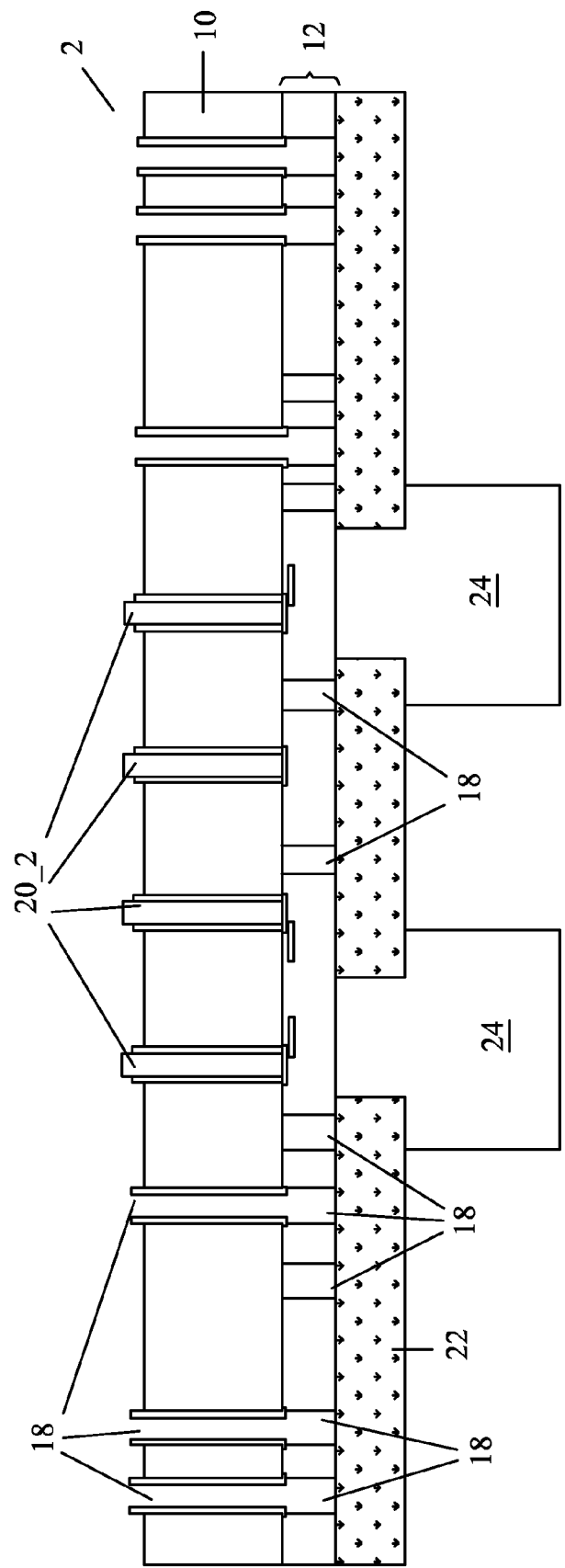

In FIG. 12, dielectric film 22 is formed. Accordingly, channels 18 are sealed. Next, as shown in FIG. 13, dielectric film 22 is patterned, followed by the formation of bumps 24 as shown in FIG. 14. In FIG. 15, back surface 10b of substrate 10 is recessed by a polish, and hence TSVs 20 (including 20_1 and 20_2) are exposed. In FIGS. 16 and 17, mask 26 is formed, through which TSVs 20_1 are removed, so that channels 18 extend from inside interconnect structure 12 into substrate 10. In FIG. 18, mask 26 is removed.

FIGS. 19 through 23 illustrate the cross-sectionals views of the processing of wafer 100, which is also referred to as a top wafer. FIGS. 19 and 20 illustrate the cross-sectional views of the formation of a first embodiment. Wafer 100 includes substrate 110, which may be a semiconductor substrate formed, for example, of silicon. Substrate 110 has front side 110a, at which semiconductor devices, such as transistors are formed, and backside 110b, at which no transistors are formed. Further, interconnect structure 112, which includes metal lines and vias in dielectric layers (not shown), is formed on front side 110a. Bumps 124 are formed over interconnect structure 112, and may be electrically connected to the semiconductor devices. Referring to FIG. 20, dielectric film 122 is applied and patterned, and bumps 124 are exposed through the openings in dielectric film 122. Dielectric film 122 may be formed of essentially the same material as dielectric film 22 in FIG. 9.

FIGS. 21 through 23 illustrate another embodiment for forming top wafer 100. FIG. 21 illustrates top wafer 100, which is essentially the same as the wafer 100 shown in FIG. 19. Next, as shown in FIG. 22, bumps 124 are formed over interconnect structure 112. Channels 118 are also formed in interconnect structure 112, by using, for example, etching. Again, although not shown, metal pipes are formed on the sidewalls of channels 118, so that channels 118 are insulated from the (low-k) dielectric materials in interconnect structure 112. Next, as shown in FIG. 23, dielectric film 122, which may be formed of essentially the same material as dielectric film 22 (FIGS. 9 and 18) is formed. Some of channels 118 are thus sealed.

FIG. 23 further illustrates the extension of channels 118 into dielectric film 122 by etching dielectric film 122. It is observed that some of channels 118 extend into dielectric material 122, and are used as the inlet(s) and the outlet(s) of the cooling agent. Those channel openings not extending into dielectric film 122 are used to route the cooling agent from the inlet(s) to the outlet(s).

Figure 24:
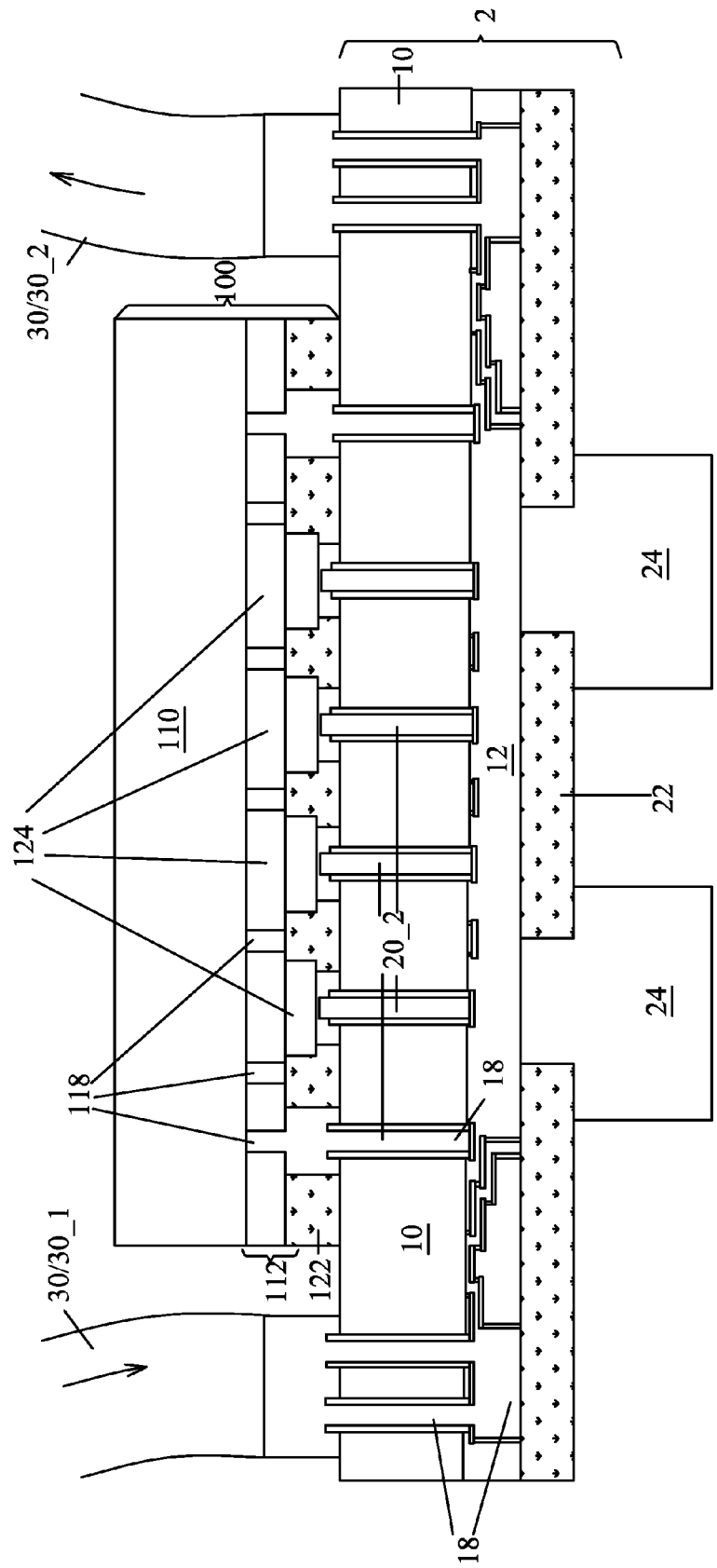
FIGS. 24 through 26 illustrate the stacking of the first wafer/die to the second wafer/die, the mounting of fluidic tubes, and the conducting of cooling agents.
Figure 25:
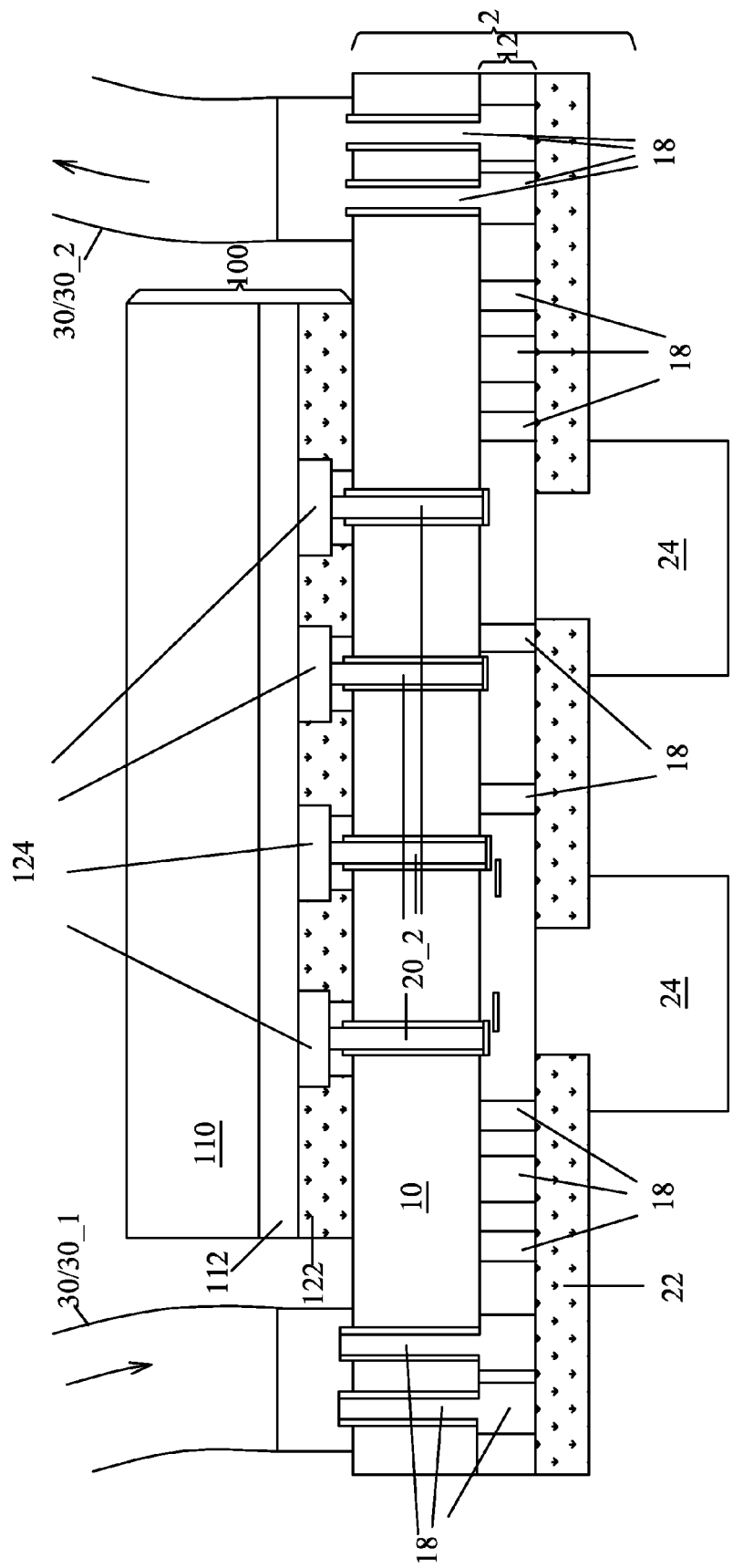
Figure 26:
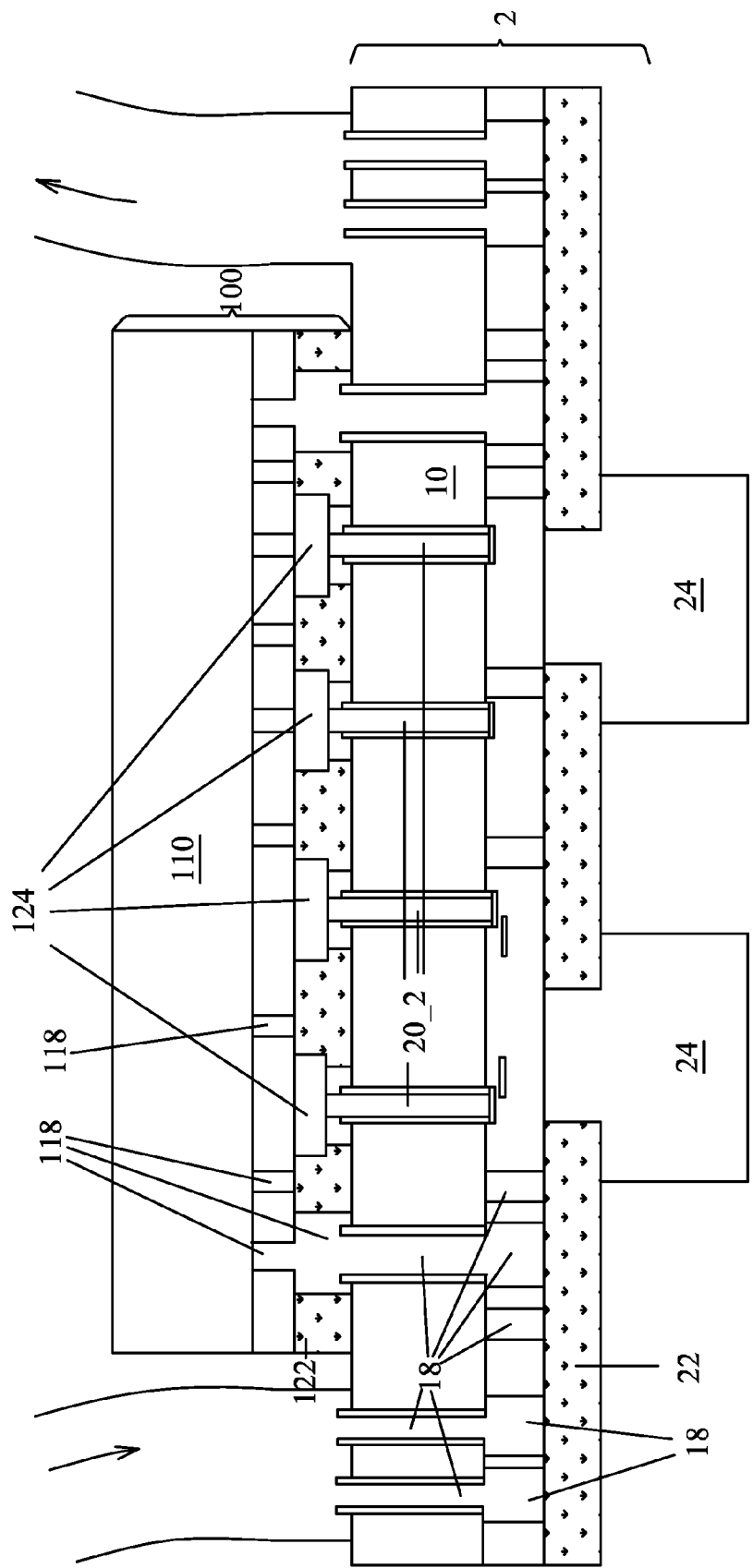

FIGS. 24 through 26 illustrate the embodiments for bonding bottom wafer 2 (or the bottom dies (also denoted using reference numeral 2) in bottom wafer 2) to top wafer 100 (or the top dies (also denoted using reference numeral 100) in top wafer 100). FIG. 24 illustrates the top die/wafer 100 shown in FIG. 23 bonded to the bottom die/wafer 2 shown in FIG. 9. It is observed that channels 118 are connected to channels 18 to form continuous channels. Dielectric film 122 is pressed against bottom die/wafer 2, and hence channels 118 are sealed. Bumps 124 are bonded to the bottom die/wafer 2 and electrically connected to TSVs 20_2.

Fluidic tubes 30 are attached to bottom die/wafer 2. FIG. 24 illustrates that one of fluidic tubes 30 is used as an inlet 30_1 of a fluid. During the operation of the stacked integrated circuit, the fluid, which acts as a cooling agent, is fed into inlets 30_1, so that it flows through channels 18 and 118 and flows out of outlet(s) 30_2. Accordingly, the heat generated during the operation of bottom die 2 is dissipated through the cooling agent. The cooling agent also flows through channels 118 in the top die 100, and hence also carries the heat out from top die 100. In an embodiment, the cooling agent is de-ionized water. In other embodiments, the cooling agent comprises ethylene glycol, phase change materials, or the like.

FIG. 27 schematically illustrate a top view, in which inlet 30_1, outlet 30_2, and channels 18 and 118 connecting inlet 30_1 to outlet 30_2 are illustrated. Channels 18 may or may not include shafts 18_3.

FIG. 25 illustrates top die/wafer 100 shown in FIG. 20 bonded to bottom die/wafer 2 shown in FIG. 18. It is observed that no channel is formed in top die/wafer 100, and hence only bottom die 2 is cooled by the cooling agent.

FIG. 26 illustrates top die/wafer 100 shown in FIG. 23 bonded to the bottom die/wafer 2 shown in FIG. 18. It is observed that channels 118 are connected to channels 18 to form continuous channels, so that the cooling agent may flow through both channels 118 and 18, and hence both top die 100 and bottom die 2 may both be cooled. Again, dielectric film 122 is pressed against bottom die/wafer 2, and hence channels 118 are sealed.

In the embodiments, channels for conducting the cooling agent are formed on the front sides of bottom dies and possibly top dies. During the operation of the bottom dies and top dies, the heat generated in the bottom dies may be carried away by the cooling agent that is flowing through the bottom dies. This results in a significant increase in the heat dissipating ability, particularly for the bottom dies. Accordingly, the embodiments may be used for dies that generating a greater amount of heat, such as central processing units.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
  forming a wafer comprising:
    forming a first interconnect structure comprising metal lines and vias in first dielectric layers, wherein the first interconnect structure is on a front side of a first semiconductor substrate;
    forming a first plurality of channels with at least a portion in the first dielectric layers; and
    laminating a dielectric film over the first interconnect structure and sealing portions of the first plurality of channels, wherein the portions of the first plurality of channels are configured to allow a fluid flowing through.

2. The method of claim 1, wherein the step of forming the first plurality of channels comprises:
  forming through-substrate vias (TSVs) in the first semiconductor substrate;
  after the step of forming the first interconnect structure, etching the first dielectric layers to form the first plurality of channels in the first interconnect structure; and
  removing the TSVs to extend the first plurality of channels into the first semiconductor substrate.

3. The method of claim 2, wherein the step of removing the TSVs is performed after the step of laminating the dielectric film.

4. The method of claim 1, wherein the first plurality of channels comprises:
  a first portion routing in a first layer of the first dielectric layers and not in a second layer of the first dielectric layers; and a second portion routing in the second layer and not in the first layer, wherein the first portion and the second portion are vertically misaligned.

5. The method of claim 1, wherein the forming the first plurality of channels comprises:
during the step of forming the first interconnect structure, forming metal lines and vias in a form of interconnected metal pipes, with materials of the first dielectric layers filling the metal pipes; and
removing the materials of the first dielectric layers in the metal pipes.

6. The method of claim 1 further comprising bonding a second die to a first die in the wafer.

7. The method of claim 6, wherein the second die comprises:
a second semiconductor substrate;
a second interconnect structure comprising metals and vias in second dielectric layers and on a front side of the second semiconductor substrate; and
a second plurality of channels in the second dielectric layers, wherein after the step of bonding the second die to the first die, the first plurality of channels and the second plurality of channels are interconnected.

8. The method of claim 6, wherein the second die comprises no channel connected to the first plurality of channels.

9. The method of claim 1 further comprising attaching a first fluidic tube and a second fluidic tube to an inlet and an outlet of the first plurality of channels, respectively.

10. The method of claim 9 further comprising conducting a cooling agent into the first fluidic tube, wherein the cooling agent flows through the first plurality of channels to the second fluidic tube.

11. A method comprising:
forming a wafer comprising:
providing a first semiconductor substrate;
forming a plurality of through-substrate vias (TSVs) in the first semiconductor substrate;
forming a first interconnect structure comprising metal lines and vias in first dielectric layers and on a front side of the first semiconductor substrate, wherein the metal lines and vias form interconnected metal pipes encircling portions of the first dielectric layers;
removing the portions of the first dielectric layers encircled by the interconnected metal pipes to form a first plurality of channels in the first dielectric layers;
laminating a dielectric film on the first interconnect structure and sealing the first plurality of channels;
polishing a backside of the first semiconductor substrate to expose the plurality of TSVs; and
removing the plurality of TSVs to extend the first plurality of channels into the first semiconductor substrate.

12. The method of claim 11 further comprising attaching a first fluidic tube and a second fluidic tube to a first one and a second one of the first plurality of channels left by the removed TSVs.

13. The method of claim 11, wherein the step of removing the TSVs is performed after the step of laminating the dielectric film.

14. The method of claim 11, wherein the first plurality of channels comprises:
a first portion routing in a first layer of the first dielectric layers and not in a second layer of the first dielectric layers; and
a second portion routing in the second layer and not in the first layer, wherein the first portion and the second portion are not vertically overlapped.

15. The method of claim 11 further comprising bonding a second die to a first die in the wafer.

16. The method of claim 15, wherein the second die comprises:
a second semiconductor substrate;
a second interconnect structure comprising metal lines and vias in second dielectric layers and on a front side of the second semiconductor substrate; and
a second plurality of channels in the second dielectric layers, wherein after the step of bonding the second die to the first die, the first plurality of channels and the second plurality of channels are interconnected.

17. The method of claim 11 further comprising attaching a first fluidic tube to a first opening left by a first one of the removed TSVs and a second opening left by a second one of the removed TSVs.

18. A method comprising:
forming a through-substrate via (TSV) extending into a semiconductor substrate;
forming an interconnect structure comprising dielectric layers and metal features in the dielectric layers, wherein the interconnect structure is on a front side of the semiconductor substrate, and the metal features form interconnected metal pipes encircling a region of the interconnect structure;
etching portions of the dielectric layers in the region to form a first channel in the dielectric layers;
sealing the first channel with a film, wherein the film and the TSV are on opposite sides of the interconnect structure;
polishing a backside of the semiconductor substrate to expose the TSV;
etching the TSV to form a second channel in the semiconductor substrate; and
etching a metal feature exposed to the second channel to interconnect the first channel and the second channel as a continuous channel.

19. The method of claim 18 further comprising attaching a fluidic tube to the second channel.

20. The method of claim 18, wherein the semiconductor substrate is comprised in a first die, and the method further comprises bonding a second die to the first die.

* * * * *